(12) United States Patent
Frigerio et al.

(10) Patent No.: US 11,841,497 B2
(45) Date of Patent: Dec. 12, 2023

(54) CLOSED-LOOP POSITION CONTROL OF MEMS MICROMIRRORS

(71) Applicants: Politecnico Di Milano, Milan (IT); STMicroelectronics S.r.l., Agrate Brianza (IT)

(72) Inventors: Paolo Frigerio, Milan (IT); Giacomo Langfelder, Milan (IT); Luca Molinari, Piacenza (IT); Giuseppe Maiocchi, Villa Guardia (IT); Andrea Barbieri, Casalpusterlengo (IT)

(73) Assignees: Politecnico Di Milano, Milan (IT); STMicroelectronics S.r.l., Agrate Brianza (IT)

( * ) Notice: Subject to any disclaimer, the term of this patent is extended or adjusted under 35 U.S.C. 154(b) by 577 days.

(21) Appl. No.: 17/109,929

(22) Filed: Dec. 2, 2020

(65) Prior Publication Data

US 2022/0171180 A1 Jun. 2, 2022

(51) Int. Cl.
*G02B 26/08* (2006.01)
*H04N 9/31* (2006.01)
(Continued)

(52) U.S. Cl.
CPC ........... *G02B 26/0833* (2013.01); *G05B 5/01* (2013.01); *G09G 3/025* (2013.01); *H03G 1/0005* (2013.01); *H04N 9/3135* (2013.01)

(58) Field of Classification Search
CPC ...... G02B 26/0833; G05B 5/01; G09G 3/025; H03G 1/0005
(Continued)

(56) References Cited

U.S. PATENT DOCUMENTS

| 11,693,231 B2 * | 7/2023 | Liao ................. G02B 26/101 |
| | | 359/291 |
| 2003/0214696 A1 * | 11/2003 | Oettinger ........... G02B 26/0833 |
| | | 359/290 |

(Continued)

FOREIGN PATENT DOCUMENTS

EP 3056936 A1 8/2016

OTHER PUBLICATIONS

EP Search Report and Written Opinion for family-related EP Appl. No. 21208720.9, report dated Apr. 12, 2022, 14 pgs.
(Continued)

*Primary Examiner* — Chun Cao
(74) *Attorney, Agent, or Firm* — CROWE & DUNLEVY (57) ABSTRACT

Disclosed herein is a control system for a projection system, including a first subtractor receiving an input drive signal and a feedback signal and generating a first difference signal therefrom, the feedback signal being indicative of position of a quasi static micromirror of the projection system. A type-2 compensator receives the first difference signal and generates therefrom a first output signal. A derivative based controller receives the feedback signal and generates therefrom a second output signal. A second subtractor receives the first and second output signals and generates a second difference signal therefrom. The second difference signal serves to control a mirror driver of the projection system. A higher order resonance equalization circuit receives a pre-output signal from an analog front end of the projection system that is indicative of position of the quasi static micromirror, and generates the feedback signal therefrom.

19 Claims, 8 Drawing Sheets

(51) Int. Cl.
*G09G 3/02* (2006.01)
*G05B 5/01* (2006.01)
*H03G 1/00* (2006.01)

(58) Field of Classification Search
USPC .......................................... 700/72; 359/224.1
See application file for complete search history.

(56) References Cited

U.S. PATENT DOCUMENTS

| | | | |
|---|---|---|---|
| 2004/0141682 A1* | 7/2004 | Mori | G02B 6/3582 |
| | | | 385/18 |
| 2015/0062681 A1* | 3/2015 | Iyad Al Dibs | B81B 3/00 |
| | | | 359/221.2 |
| 2020/0184868 A1 | 6/2020 | Shen et al. | |
| 2020/0374495 A1* | 11/2020 | Gibson | G02B 26/0833 |

OTHER PUBLICATIONS

"Demystifying Type II and Type III Compensators Using OpAmp and OTA for DC/DC Converters", Jul. 2014 (Jul. 2014), XP002806199, 16 pgs.
"PID controller, Lead/Lag, Type 2 and Type 3 controller", Sep. 4, 2014 (Sep. 4, 2014), XP002806200, 2 pgs.
"Lead-lag compensator", Mar. 30, 2019 (Mar. 30, 2019), XP002806201, 3 pgs.

* cited by examiner

CLOSED-LOOP POSITION CONTROL OF MEMS MICROMIRRORS

TECHNICAL FIELD

This disclosure is directed to the field of MEMS mirrors and, in particular, to a circuit and technique for driving MEMS mirrors with closed loop control in a way that dampens fundamental resonant modes while extending system bandwidth.

BACKGROUND

A laser beam scanning module (LBS Module) is usable within different small, portable electronic devices to perform, for example, 3D sensing, LIDAR based sensing, or projection. As an example, a scanning projector or "picoprojector" is a small, portable electronic device utilizing such a LBS module. Picoprojectors are typically paired to, or incorporated within, user devices such as smart glasses, smartphones, tablets, laptops, or digital cameras, and used to project virtual and augmented reality, documents, images, or video stored on those user devices onto a projection surface, such as a wall, light field, holographic surface, or inner display surface of virtual or augmented reality glasses.

In greater detail, typical LBS modules are comprised of a laser source and one or more microelectromechanical (MEMS) mirrors to scan the laser beam produced by the laser source across the projection surface in a projection pattern. As an example, in the case where a LBS is used in a picoprojector, by modulating the laser beam according to its position on the projection surface, while the laser beam is scanned in the projection pattern, an image stream is displayed. Commonly, at least one lens focuses the beam before or after reflection by the one or more MEMS mirrors, and before the laser beam strikes the projection surface, although optical modules of other designs may be used.

The projection subsystem controls the driving of the laser source and the driving of the movement of the one or more MEMS mirrors. Typically, the driving of movement of one of MEMS mirrors is at, or close to, the resonance frequency of that MEMS mirror, and the driving of movement of another of the MEMS mirrors is performed linearly.

Even quasi static MEMS mirrors (e.g., those driven linearly) have mechanical resonance frequencies. Since the drive signal for those mirrors is typically formed by one or more segments with a fast slope (e.g., having a high first derivative), the mechanical resonance may generate ringing/ripple in the angular mirror position. Such ringing may result in disturbances in the effective travel path of the mirror. Existing open loop driving techniques pre-distort a drive signal for the linearly driven MEMS mirrors, which does help to partially compensate for this ringing. However, such open loop driving techniques are limited in terms of being able to accurately position the linearly driven MEMS mirrors, and do not address issues introduced by external vibrations introduced into the linearly driven MEMS mirrors.

Some modern picoprojector systems and raster scanning systems, such as those incorporated into virtual reality and augmented reality systems, drive their quasi static MEMS mirrors at frequencies close to the mirror mechanical resonance. For light detection and ranging (LIDAR) and 3D sensing applications, step-wise quasi static MEMS mirror actuation is of particular interest, and this actuation utilizes system bandwidths of greater than 2 khz, which cannot be achieved with open loop driving techniques while maintaining the desired mechanical opening angle. The relatively large quality factor (e.g., 100) and low frequency (about 500-1000 Hz) of the fundamental resonant mode of quasi statically driven MEMS micromirrors hinders open loop driving by typical 60-300 Hz signals as they generate spurious ringing of position of the MEMS micromirror.

Therefore, it is clear that further development into the driving of quasi static MEMS micromirrors is necessary, for example to dampen fundamental resonant modes, while extending the system bandwidth.

SUMMARY

Disclosed herein is a control system for a projection system. The control system includes a first subtractor receiving an input drive signal and a feedback signal and configured to generate a first difference signal therefrom, the feedback signal being indicative of position of a micromirror of the projection system. The control system also includes a type-2 compensator configured to receive the first difference signal and generate therefrom a first output signal, a derivative based controller configured to receive the feedback signal and generate therefrom a second output signal, and a second subtractor receiving the first and second output signals and configured to generate a second difference signal therefrom, with the second difference signal serving to control a mirror driver of the projection system. A higher order resonance equalization circuit receives a pre-output signal from an analog front end of the projection system that is indicative of position of the micromirror, and generates the feedback signal therefrom.

The type-2 compensator may be lead-lag based and process the first difference signal such that the first output signal serves to extend system bandwidth while compensating for non-linearities in mirror spring behavior and/or compensating for actuation non-linearities.

The derivative based controller may process the feedback signal such that the second output signal serves to dampen a quality factor of a fundamental resonant mode of the micromirror.

The higher order resonance equalization circuit may remove higher order resonances from the pre-output signal introduced by the micromirror.

The first subtractor, type-2 compensator, derivative based controller, second subtractor, and higher order resonance equalization circuit may be implemented as digital circuits. A digital to analog converter may convert the second difference signal to analog form. An analog to digital converter may digitize the pre-output signal, and a low pass filter may filter the pre-output signal before processing by the higher order resonance equalization circuit.

The type-2 compensator may include a gain stage receiving the first difference signal and configured to apply gain thereto, a first integrator receiving output of the gain stage and configured to perform an integration, a second integrator receiving output of the first integrator and configured to perform an integration, and a lead-lag filter receiving output of the second integrator and configured to apply filtering thereto.

An anti-windup technique is applied to the first and second integrators to allow them to quickly recover from saturation at startup and during transients.

The first subtractor, type-2 compensator, derivative based controller, second subtractor, and higher order resonance equalization circuit may be implemented as analog circuits. The first subtractor may be a first amplifier having an inverting input coupled to the higher order resonance equalization circuit through a first resistor and coupled to an output of the first amplifier through a second resistor, and a non-inverting input coupled to receive the input drive signal through a third resistor.

The type-2 compensator may include a second amplifier having a non-inverting input coupled to ground, and having an inverting input coupled to the output of the first amplifier through a fourth resistor. A first series RC circuit may be coupled between an inverting input and an output of the second amplifier. A first clamp may be coupled between the inverting input and the output of the second amplifier. A third amplifier may have a non-inverting input coupled to ground, and an inverting input coupled to the output of the second amplifier through a first parallel RC circuit.

A second series RC circuit may be coupled between the inverting input and the output of the third amplifier. A second clamp may be coupled between the inverting input and the output of the third amplifier. A fifth resistor may couple the output of the third amplifier and the second subtractor.

The second subtractor may include a fourth amplifier having a non-inverting input coupled to the fifth resistor, and coupled to ground through a sixth resistor, the fourth amplifier also having an inverting input7 coupled to the derivative based controller through a sixth resistor. A second parallel RC circuit may be coupled between the inverting input and an output of the fourth amplifier. A third clamp may be coupled between the output of the fourth amplifier and ground.

The derivative based controller may include a fifth amplifier having a non-inverting input coupled to ground through a seventh resistor, and coupled to the third resistor through a capacitor. A third parallel RC circuit may be coupled between an inverting input of the fifth amplifier and an output of the fifth amplifier, the output of the fifth amplifier being coupled to the sixth resistor. An eighth resistor may be coupled between the inverting input of the fifth amplifier and ground.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
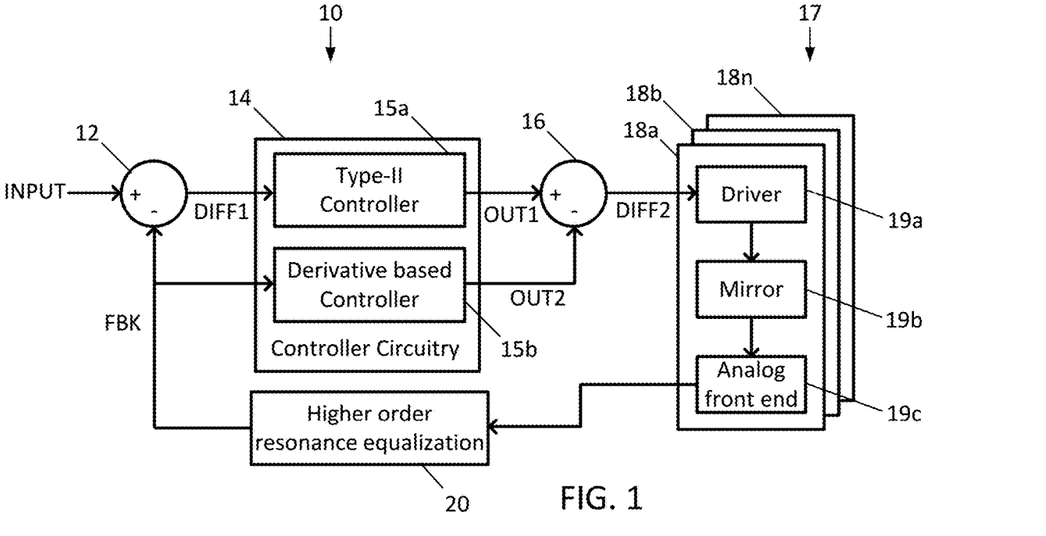
FIG. 1 is a block diagram of a control system for a quasi static micromirror equipped device, as disclosed herein.

Now described with initial reference to FIG. 1 is a control system 10 for a quasi static micromirror equipped device 17, with the MEMS subsystem of a laser beam scanning (LBS) module that may be used in a picoprojector or in other applications. The device 17 includes projection systems or plants 18a, . . . , 18n (with n being any integer greater than or equal to 1), each including a mirror driver 19a driving a quasi static micromirror 19b (formed using microelectromechanical system technology), and an analog front end 19c receiving an output signal from a piezoresistive or piezoelectric position sensor associated with the quasi static micromirror 19b.

The control system 10, as will be described in detail below, may be implemented using analog components, digital components, or mixed-signal components. However, with reference to FIG. 1, the control system 10 will be generally described in principles that apply to both analog and digital embodiments.

Now beginning with the description, a higher order resonance equalization circuit 20 receives output from the analog front end 19c, and generates a feedback signal FBK therefrom by performing a compensation that equalizes the sensing path to remove higher order resonances introduced by the quasi static micromirror 19b. The feedback signal FBK is indicative of the current position of the quasi static micromirror 19b.

A subtractor 12 receives an input signal INPUT and the feedback signal FBK, and provides the difference DIFF1 between the input signal INPUT and the feedback signal FBK to controller circuitry 14. The input signal INPUT is a reference signal for the quasi static micromirror 19b, and is sawtoothed in shape, having a frequency between 60 Hz and 120 Hz, and having a 90% rise time. The input signal INPUT is representative of the desired position of the quasi static micromirror 19b, and the difference signal DIFF1 represents positional error of the quasi static micromirror.

The controller circuitry 14 includes a type-2 compensator based controller 15a and a derivative based controller 15b. As known to those of skill in the art, a type-2 compensator has two poles at the origin to null the steady-state error to a ramp signal. An additional pole-zero pair in the type-2 compensator provides a phase boost at the geometric mean of the pole and zero frequencies. As also known to those of skill in the art, derivative controllers respond to the change in error (here represented by the feedback signal FBK) with time. If the absolute value of error is rapidly decreasing and the setpoint is near, it is likely that the setpoint will be reached and the error will change sign and increase in the other direction. The derivative mode is useful in preventing this situation.

Figure 2A:
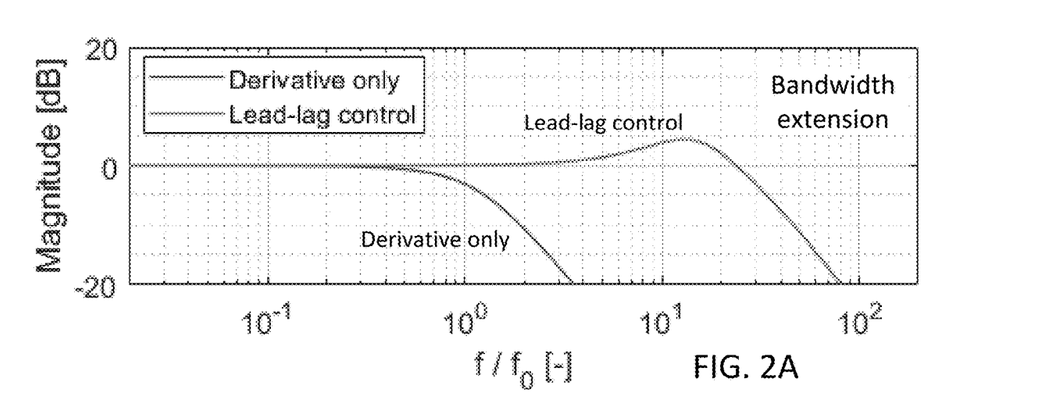
FIGS. 2A-2B are bode plots of the input-angle transfer function of the control system when employing the controller circuitry described herein applied to a typical quasi static micromirror.
Figure 2B:
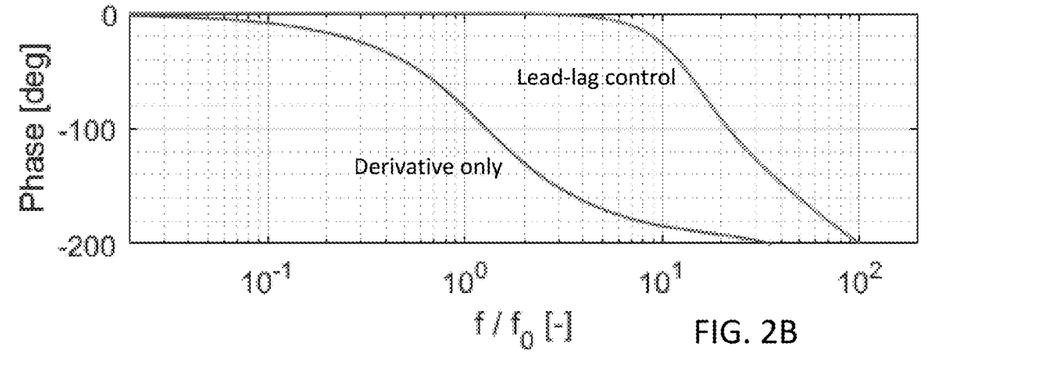

The type-2 compensator based controller 15a receives the difference DIFF1, processes the difference DIFF1 to generate therefrom a first controller output OUT1, which is passed to a subtractor 16. The processing of the difference DIFF1 to generate the first controller output OUT1 performed by the type-2 compensator based controller 15a is lead-lag based and aims to achieve substantially no error between the input signal and position of the quasi static micromirror 19b, compensating for non-linearities in mirror rigidity, and extending the system bandwidth. This bandwidth extension can be seen in the graphs FIGS. 2A-2B, showing a comparison between the closed loop transfer function from INPUT to the mirror opening angle (normalized to the mirror opening angle) in one case where only the derivative based controller 15b is applied and in one case where both the derivative based controller 15b and the type-2 controller 15a are applied. These plots show the effect of the full controller 14 in extending the system bandwidth vs the effect of the simpler derivative based one.

Figure 3A:
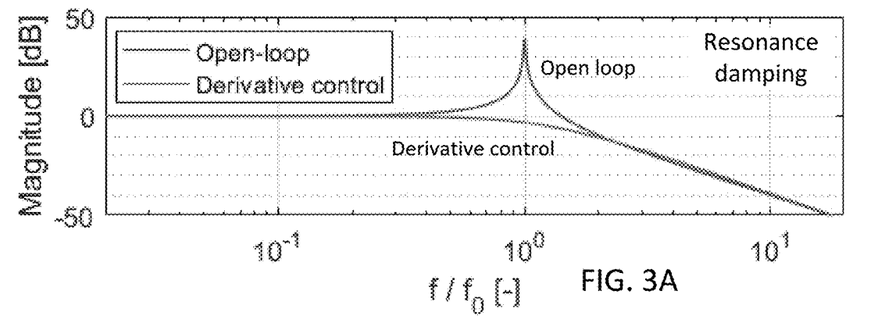
FIGS. 3A-3B shows the dampening of the quality factor of the fundamental resonant mode of the quasi static micromirror performed by the control system described herein.
Figure 3B:
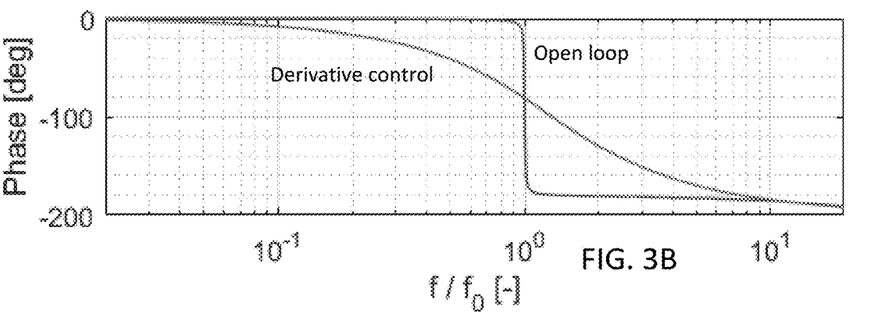

The derivative based controller 15b also receives the feedback signal FBK, and processes the feedback signal FBK to generate therefrom a second controller output OUT2, which is passed to the subtractor 16. The processing of the feedback signal FBK to generate the second controller output OUT2 performed by the derivative based controller 15b uses the derivative of the feedback signal FBK to identify and dampen the quality factor of the fundamental resonant mode of the quasi static micromirror 19b (e.g., dampen the resonance peak). FIGS. 3A-3B show a comparison between the open loop transfer function from INPUT to the mirror opening angle, and the corresponding closed loop transfer function when only the derivative based controller 15b is applied. Dampening can be seen in FIG. 3A, where it can be seen that without the derivative based controller 15b, the feedback signal would have a peak, but with the derivative based controller 15b, the peak is dampened. Shown in FIG. 3B is how this also results in dampening in the phase.

The subtractor 16 provides the difference DIFF2 (representing the difference between between the first controller output OUT1 and the second controller output OUT2) to the plants 18a . . . 18n.

Figure 4:
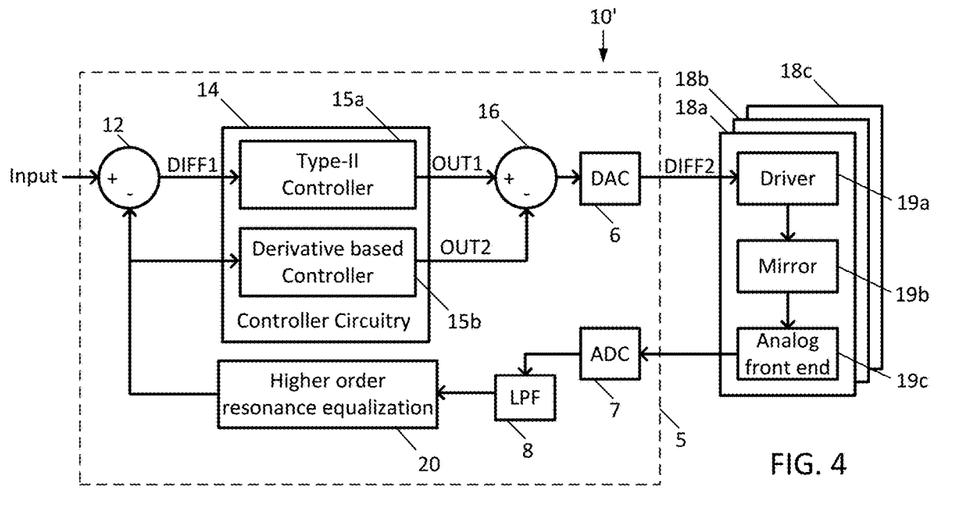
FIG. 4 is a block diagram of a digital embodiment of the control system of FIG. 1.
Figure 5:
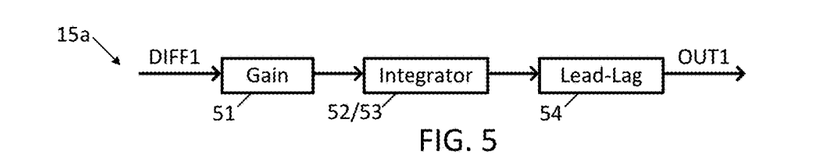
FIG. 5 is a block diagram of the type-2 compensator based controller of the control system of FIG. 4.

A digital implementation of the control system 10' is now described with reference to FIG. 4. In the digital implementation, the subtractors 12 and 16, the controller 14 (which includes the type-2 compensator based controller 15a and the derivative based controller 15b), and the higher order resonance equalization 20 are implemented digitally. In addition, a digital-to-analog converter (DAC) 6 converts the output of the subtractor 16 to produce an analog version of the difference DIFF2, and an analog-to-digital converter (ADC) 7 digitizes the output of the analog front end 19c, and the resulting digital value is then passed through a digital low pass filter 8 before being passed to the higher order resonance equalization 20. The structure of the type-2 compensator based controller 15a is shown in FIG. 5, where it can be observed that the controller 15a includes a gain stage 51 receiving the difference DIFF1, a dual integrator stage 52 or 53 (meaning it can have the structure of either circuit 52 or 53, described below) receiving the output of the gain stage, and a lead-lag stage receiving the output of the dual integrator stage and providing the output OUT1.

Referring back to FIG. 4, in greater detail, the ADC 7 converts the output of the analog front end 19c into a digital signal. High frequency noise is filtered by low-pass filter 8, and digital block 20 introduces a shaping of the transfer function to minimize the effect of high order resonance modes of the mirror. This block is implemented as a cascade of several digital biquadratic filters, depending on the mirror resonance profile. The transfer function of the j-th unit cell (i.e. biquad filter) of block 20 is:

$$H_{BQj}(z) = \frac{b_{0j} + b_{1j}z^{-1} + b_{2j}z^{-2}}{a_{0j} + a_{1j}z^{-1} + a_{2j}z^{-2}}$$

With this circuitry in place, the transfer function from the input of DAC 6 to the output of block 20 (signal FBK of FIG. 1) has two dominant complex-conjugate poles corresponding to the plant dominant poles, plus additional high frequency singularities within DAC 6, ADC 7 and LPF 8. The controller circuitry 14 is applied to the shaped signal FBK, and is comprised of a derivative based controller 15b that controls the velocity of the mirror by generating the actuation signal OUT2, and a type-2 controller 15a that controls the position of the mirror by generating actuation signal OUT1. The type-2 controller 15a contains two poles at the origin to minimize (ideally set to zero) the error between INPUT and FBK in steady state when INPUT is a ramp or sawtooth signal with 60-120 Hz frequency. The type-2 controller 15a also contains three zeros and one pole that set the stability of the system. The actuation signals OUT1 and OUT2 are subtracted by subtractor 16 and form the proper actuation signal, which is converted back to the analog domain by DAC 6 into signal DIFF2. Each plant 18a-18c contains a respective driver 19a to shift the voltage level of DIFF2 up to the level desired by the specific driven quasi static micromirror.

Figure 6A:
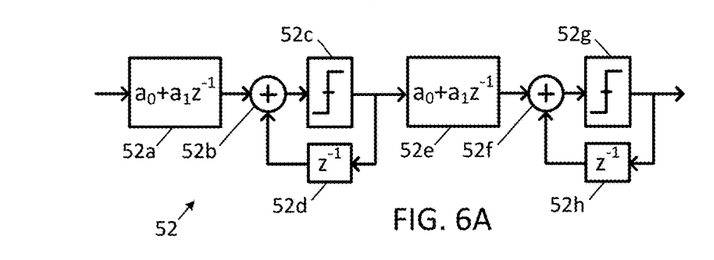
FIG. 6A is a block diagram of a first implementation of an integrator for use in the type-2 compensator based controller of FIG. 5 using antiwindup.
Figure 6B:
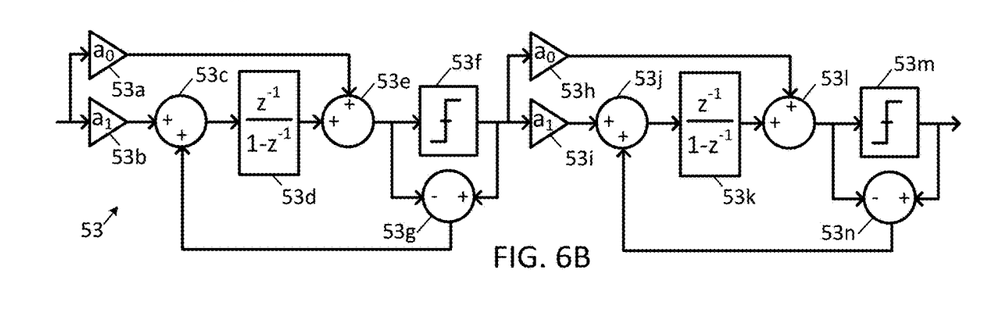
FIG. 6B is a a block diagram of a second implementation of an integrator for use in the type-2 compensator based controller of FIG. 5 using antiwindup.

The two integrators in the type-2 controller 15a can be implemented by either the cascaded arrangements 52 shown in FIG. 6A, or equivalently by the cascaded arrangements 53 shown in FIG. 6B. Both implementations share a similar transfer function but differ in the sizing of coefficients and in the management of saturation. The transfer function of implementation 52 is:

$$\frac{a_0 + a_1 z^{-1}}{1 - z^{-1}}$$

The transfer function of implementation 53 is:

$$\frac{a_0 + (a_1 - a_0)z^{-1}}{1 - z^{-1}}$$

Figure 8:
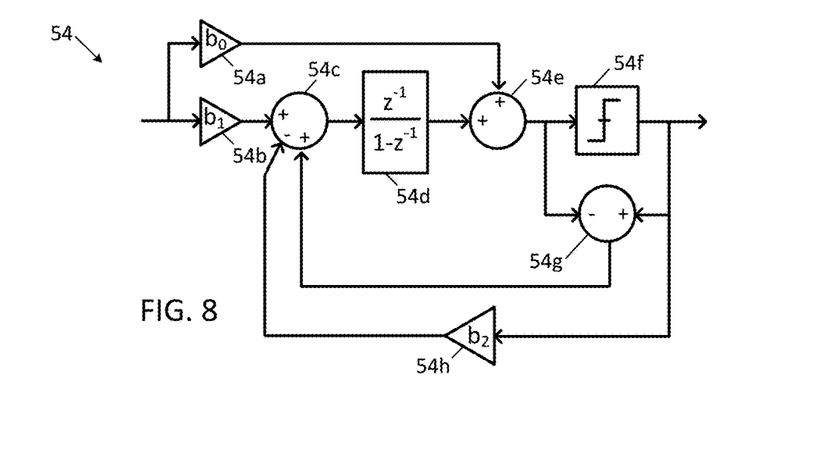
FIG. 8 is a diagram visually representing the transfer function of the lead-lag filter of the type-2 compensator based controller of FIG. 5.

The additional lead-lag filter 54 contains one zero and one pole to set the stability of the system. Its implementation is provided in FIG. 8. Its transfer function is:

$$\frac{b_0 + (b_1 - b_0)z^{-1}}{1 + (b_2 - 1)z^{-1}}$$

The derivative controller 15b shares the same implementation, and the derivative is obtained by a proper choice of coefficients.

Similarly to the analog embodiment described below, the behavior in time of the signals in the loop in steady-state conditions when INPUT is a ramp signal is as follows: the output of the derivative based controller 15b, OUT2, is a signal proportional to the derivative of the mirror position in time, signal DIFF1 is a minimized constant signal (ideally zero), the output of the first integrator 52 is a constant non-zero signal, and the output of integrator 53 and the output of lead-lag filter 54 are ramp signals. The actuation signal DIFF2 is a ramp signal whose transients are shaped in order to obtain a mirror position profile following the INPUT ramp with no residual ringing and minimized delay.

The digital implementation of the control system 10' can be formed using low-latency components, may be implemented in a microcontroller, or may be implemented in an ASIC, as desired.

Figure 7:
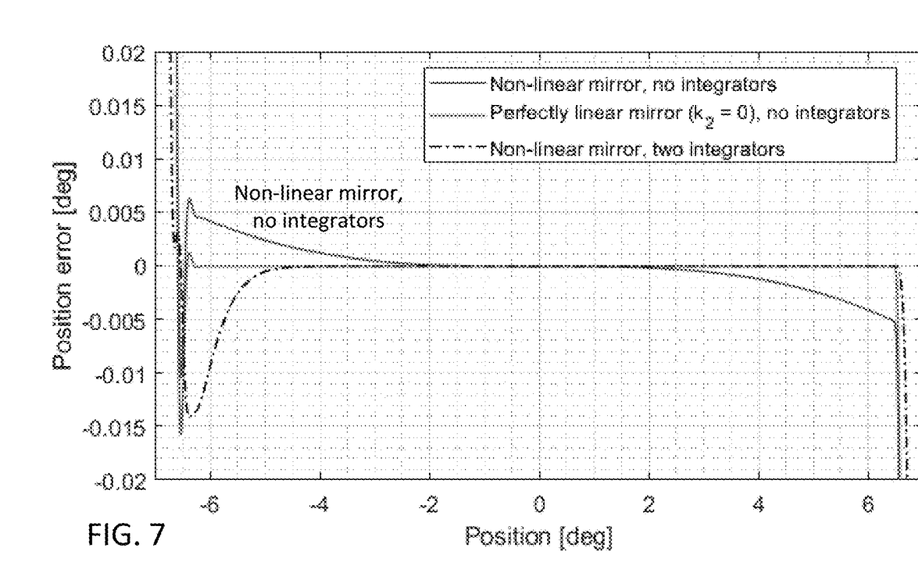
FIG. 7 is a graph showing positional error of the quasi static micromirror verses mechanical micromirror angle, when using the correction provided by the type-2 compensator based controller of FIG. 5.

FIG. 7 shows the mirror position error derived from simulations of the system 10' in different conditions. In all the cases the quasi static micromirror 19b is driven by a sawtooth signal, and the error is calculated as the difference between the simulated position on the rising part of the sawtooth (which is the useful part for projection) and its linear fitting (the error shows the deviation of the mirror position from an ideal ramp). In one condition (the solid line with the lesser y-axis values) a mirror with an ideally linear rigidity is controlled by the system 10 depicted in FIG. 1, where the integrators in block 15a are bypassed (e.g., the controllers applied are the derivative controller 15b and the lead-lag filter within block 15a); this shows that an ideally linear quasi static micromirror can be theoretically well controlled with no integrators in the system. In a second condition (labeled non-linear mirror, integrators) a quasi static micromirror with a significant non-linear component in its rigidity is driven as in the previous case (e.g., without integrators); this shows that a residual non-linear error can be observed in the mirror position. In the last condition (the dashed curve) the non-linear mirror of the previous case is now driven by introducing also the two integrators of block 15a; this shows that the non-linear error is compensated.

Figure 9A:
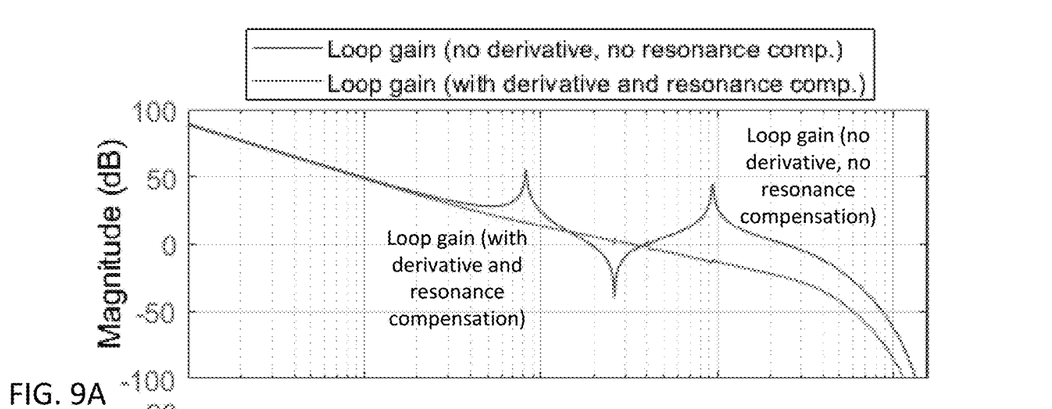
FIGS. 9A-9B are graphs showing the smoothing of the system open loop gain utilizing the control system described herein.
Figure 9B:
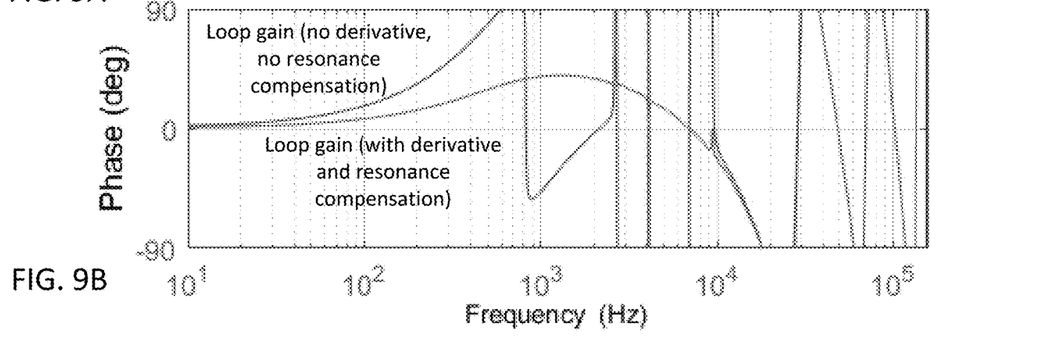

FIGS. 9A-9B show the Bode plot of the loop transfer function of the system 10' when the plant 18a contains a quasi static micromirror 19b with a significant secondary mechanical resonance at about 10 kHz (open loop curve). The closed loop curve shows the same transfer function when the higher order resonance equalization circuit 20 used for the management of high order resonances is introduced in the loop, and shows how spurious resonances have been corrected.

Figure 10:
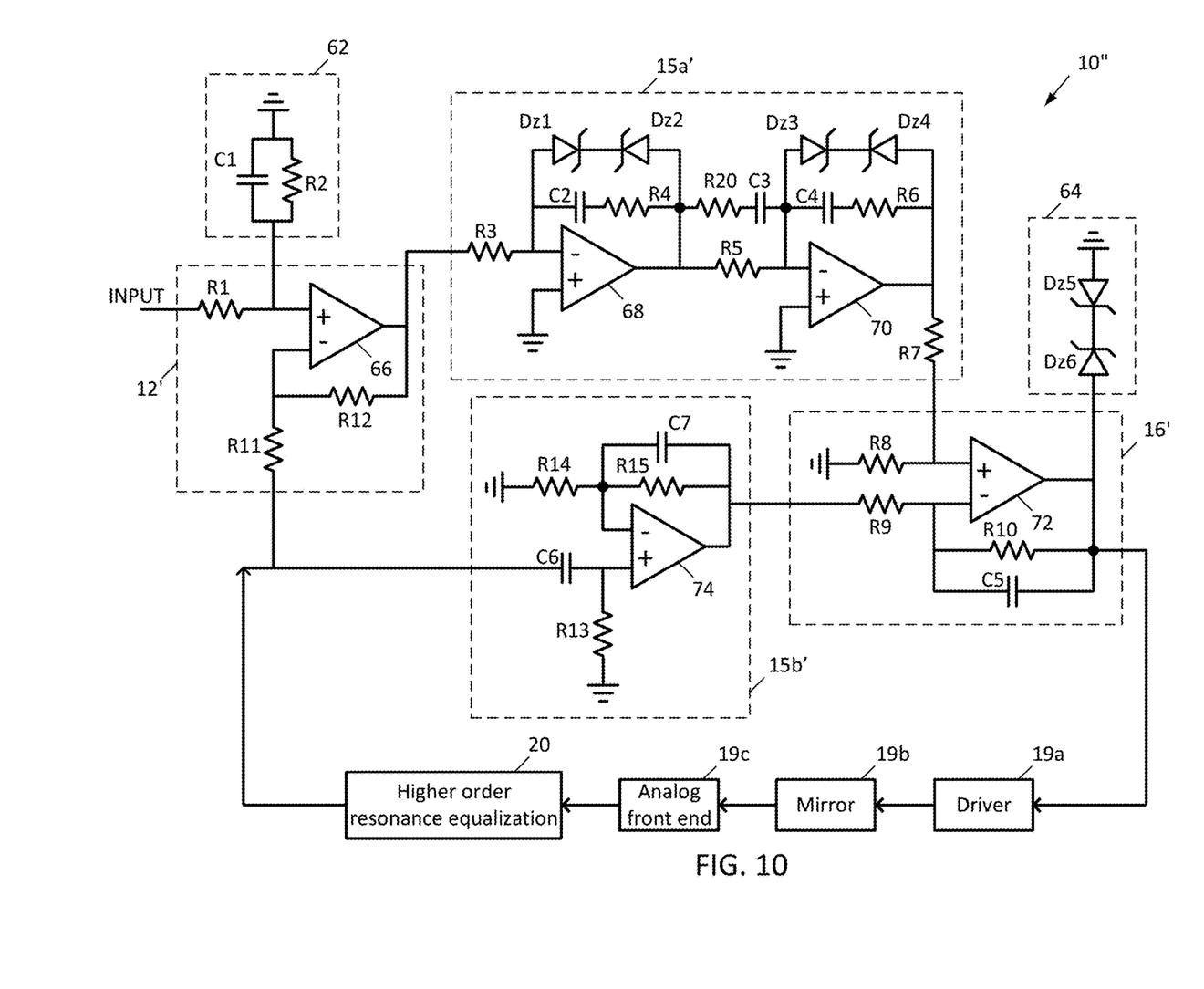
FIG. 10 is a schematic diagram of an analog embodiment of the control system of FIG. 1.

With reference to FIG. 10, an analog implementation of the control system 10" is now described. Here, it can be seen that the subtractor 12' is a differential amplifier 66 having its non-inverting input coupled to receive the input signal INPUT through resistor R1, its output coupled to its non-inverting input through resistor R12, and its non-inverting input also coupled to the derivative based controller 15b' through resistor R11. There is an input bandwidth limitation circuit 62 coupled between the non-inverting input of the amplifier 66 and ground, and the input bandwidth limitation circuit 62 includes a capacitor C1 and resistor R2 coupled in parallel.

Turning now to the controller circuitry, the type-2 compensator based controller 15a' is comprised of cascaded amplifiers 68 and 70. The amplifier 68 has its non-inverting input grounded, and has its inverting input coupled to the output of the amplifier 66 through resistor R3. Series connected capacitor C2 and resistor R4 are coupled between the inverting input and the output of the amplifier 68. A zener diode Dz1 has its anode coupled to the inverting input of the amplifier 68 and its cathode coupled to the cathode of zener diode Dz2, which in turn has its anode coupled to the output of the amplifier 68. Series connected resistor R20 and capacitor C3 are coupled in parallel with resistor R5 between the output of the amplifier 68 and the inverting input of the amplifier 70. The amplifier 70 has its non-inverting input grounded, and has series connected capacitor C4 and resistor R6 coupled between its inverting input and its output. A zener diode Dz3 has its anode coupled to the inverting input of the amplifier 70 and its cathode coupled to the cathode of zener diode Dz4, which in turn has its anode coupled to the output of the amplifier 70. The output of the amplifier 70 is coupled to the subtractor 16' through resistor R7.

The derivative based controller 15b' includes an amplifier 74 having its non-inverting input coupled to ground through resistor R13, and coupled to the higher order resonance equalization circuit 20 through capacitor C6. The amplifier 74 has its inverting terminal coupled to its output through parallel connected resistor R15 and capacitor C7, and also has its inverting terminal coupled to ground through resistor R14.

The subtractor 16' includes an amplifier 72 having its non-inverting input coupled to ground through resistor R8, and has its inverting input coupled to the output of the amplifier 74 through the resistor R9. The inverting input of the amplifier 72 is coupled to its output through parallel connected resistor R10 and capacitor C5. A voltage clamp 64 is coupled between the output of the amplifier 72 and ground. The voltage clamp 64 includes a zener diode Dz6 having its anode coupled to the output of the amplifier 72 and its cathode coupled to the cathode of zener diode Dz5, which in turn has its anode coupled to ground.

In operation, the circuit 12' implements the subtractor 12 between INPUT and FBK. The circuit 62 implements a low-pass filter on the INPUT signal. When INPUT is a ramp signal, in steady state the output of the amplifier 66 is constant and minimized (ideally zero). As stated, the circuits in 15a' implement the type-2 controller. When INPUT is a ramp signal, the output of the amplifier 68 is a constant signal in steady state, and the output of the amplifier 70 is a linear ramp signal in steady state. Zener diodes Dz1, Dz2, Dz3 and Dz4 clamp the voltage on the integrating capacitors C2 and C4 to a max value decided based on the mirror opening angle, implementing the anti-windup scheme for this described analog embodiment. As stated, the circuit 16' implements the subtractor 16 of FIG. 1. Zener diodes Dz5 and Dz6 limit the maximum actuating voltage. The circuit 15b' implements the derivative based controller 15b. The high-pass filter made of C6 and R13 implements the derivative on FBK signal. The output of amplifier 74 is a signal proportional to the time derivative of the mirror position. Additional capacitors C7 and C5 introduce additional low-pass filtering. The driver stage 19a increases actuation voltage to the level needed by the micromirror. The analog front end 19c amplifies the piezoresistive sensor output for processing by subsequent stages. The resonance equalization filter 20 shapes the transfer function to limit the impact of high order resonance modes of the mirror in the control loop gain.

The combined transfer function of circuit 15a' from the output of amplifier 66 ($V_{o66}$) to the output of amplifier 70 ($V_{o70}$) is:

$$H(s) = \frac{V_{o70}(s)}{V_{o66}(s)} = \frac{1+sC_2R_4}{sC_2R_3} \cdot \frac{1+sC_4R_6}{sC_4R_5} \cdot \frac{1+sC_3(R_5+R_{20})}{1+sC_3R_{20}}$$

The transfer function of block 16' from the output of amplifier 70 ($V_{o70}$) and from the output of amplifier 74 ($V_{o74}$) to the output of amplifier 72 ($V_{o72}$) is:

$$V_{o72} = V_{o70}(s)\frac{R_8}{R_8+R_7}\left(1+\frac{R_{10}}{R_9(1+sC_5R_{10})}\right) - V_{o74}(s)\frac{R_{10}}{R_9(1+sC_5R_{10})}$$

The transfer function of circuit 15b' from the output of the high order resonance equalization block 20 ($V_{FBK}$) to the output of amplifier 74 ($V_{o74}$) is:

$$H(s) = \frac{V_{o74}(s)}{V_{FBK}(s)} = \frac{sC_6R_{13}}{1+sC_6R_{13}}\left(1+\frac{R_{15}}{R_{14}(1+sC_7R_{15})}\right)$$

The transfer function of block 12' from INPUT ($V_{in}$) and FBK ($V_{FBK}$) to the output of amplifier 66 ($V_{o66}$):

$$V_{o66}(s) = V_{in}(s)\left(1+\frac{R_{12}}{R_{11}}\right)\frac{R_2}{R_1+R_2}\frac{1}{1+\frac{sC_1R_1R_21}{R_1+R_2}} - V_{FBK}(s)\frac{R_{12}}{R_{11}}$$

The transfer function of the resonance management block 20 depends on the specific mirror, but it is implemented as a cascade of several biquadratic filters that depends on the mirror resonance profile. The generic transfer function of the j-th unit cell of block 20 in the continuous time domain is:

$$H_{BQj}(s) = G_j \cdot \frac{1+\frac{s}{\omega_{zj}Q_{zj}}+\frac{s^2}{\omega_{zj}^2}}{1+\frac{s}{\omega_{pj}Q_{pj}}+\frac{s^2}{\omega_{pj}^2}}$$

and in the discrete time domain, for a digital implementation of the block, is:

$$H_{BQj}(z) = \frac{b_{0j}+b_{1j}z^{-1}+b_{2j}z^{-2}}{a_{0j}+a_{1j}z^{-1}+a_{2j}z^{-2}}$$

Figure 11A:
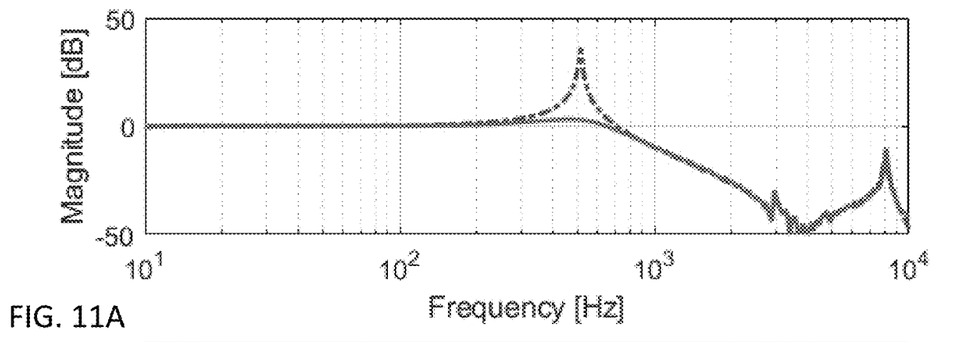
FIGS. 11A-11B show graphs of the effect of the control system described herein on the transfer function from the input to the output of the analog front end of the quasi static micromirror equipped device.
Figure 11B:
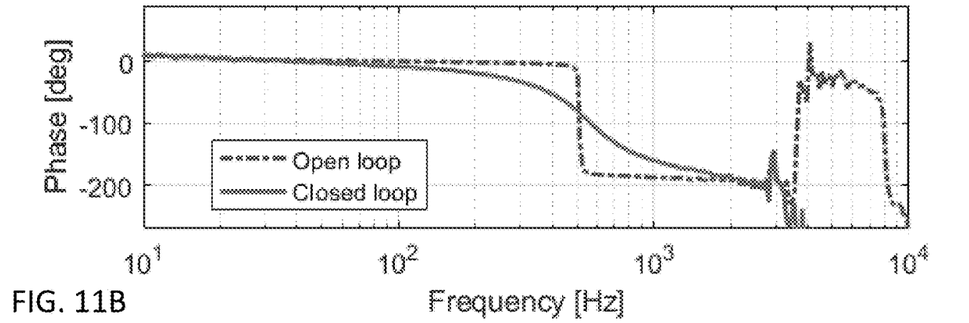

Sample graphs of the transfer function from the input to the output of the analog front end 19c can be seen in FIGS. 11A-11B, where it can be observed that with the closed loop design of the control system 10, 10', 10", the transfer function is smoothed. In greater detail, FIGS. 11A-11B show a measurement of the transfer function from INPUT to FBK performed on an implementation of the analog embodiment where only the derivative controller 15b was applied. The measurement shows a comparison between the open-loop and closed-loop transfer function. This plot confirms the plot shown in FIG. 3, in the sense that the derivative only controller is unable to extend the bandwidth of the system beyond mechanical resonance.

Figure 12:
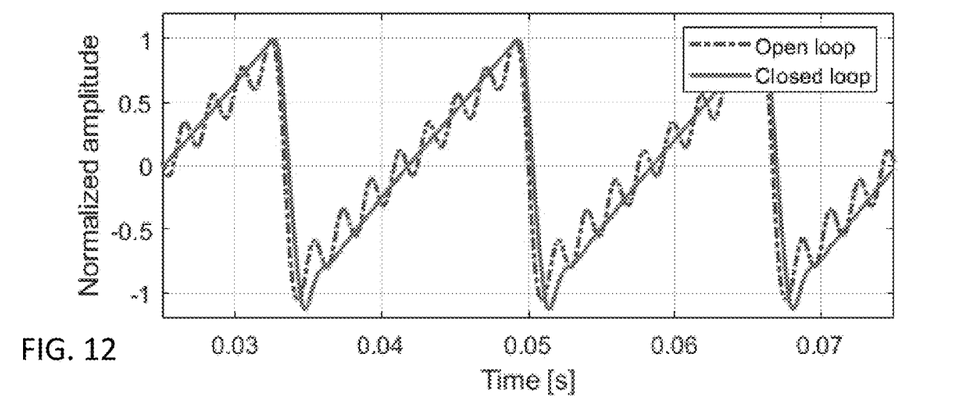
FIG. 12 is a graph showing a comparison between open loop and closed loop time response corresponding to the same measurement conditions of FIGS. 11A-11B.

In addition, in FIG. 12, it can be seen that ringing on the output of the analog front end 19c is smoothed with the use of the control system 10, 10', 10". In greater detail, FIG. 12 shows a comparison between the open-loop and closed-loop time response corresponding to the same measurement conditions of FIG. 11A/B. The signal shown is FBK, normalized to the mirror opening angle, when the system is driven by a sawtooth INPUT signal.

Figure 13A:
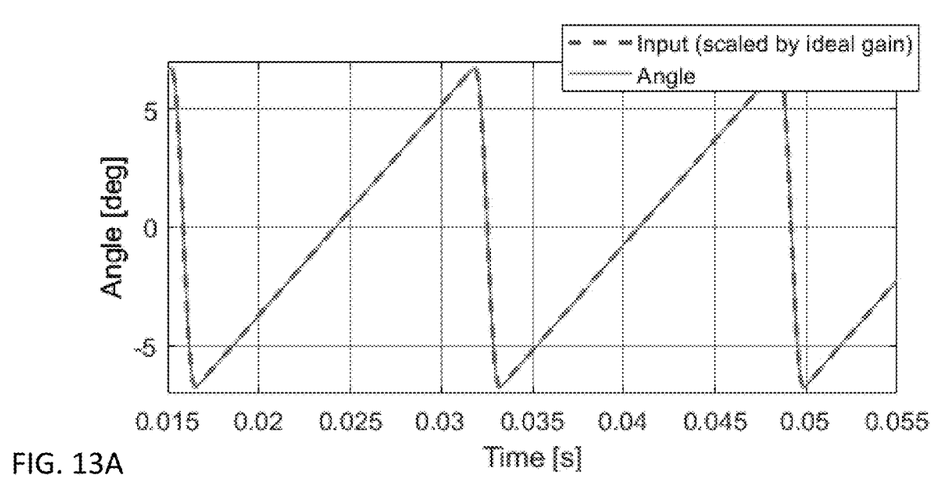
FIG. 13A is a graph showing a simulation of the control system of FIG. 1 with both controllers applied to a mirror without high order mechanical resonances.
Figure 13B:
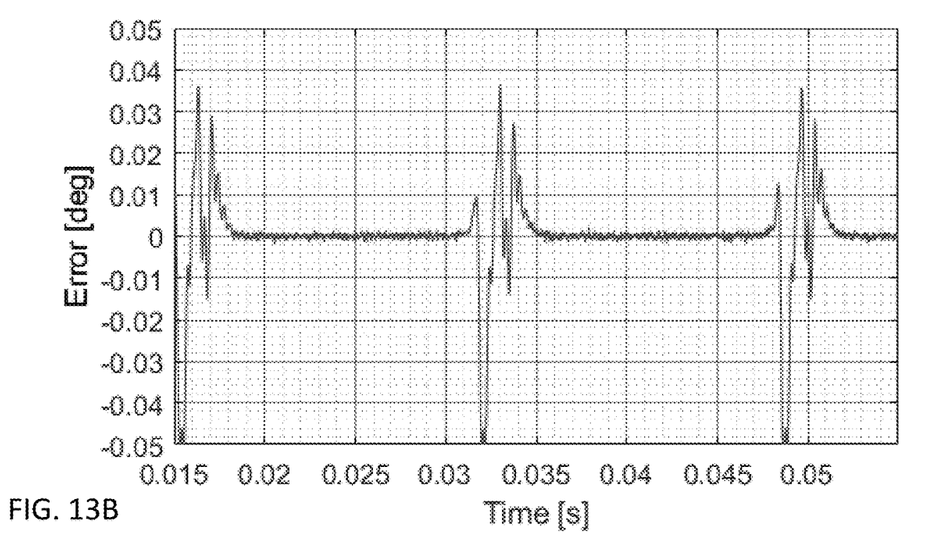
FIG. 13B is a graph showing the error between the two signals represented in FIG. 13A.

In addition, the well matched correspondence between the input signal INPUT and the opening angle of the micromirror 19b can be seen in FIGS. 13A-13B. In greater detail, FIGS. 13A-13B show a simulation of the entire system with both the controllers 15a and 15b applied to a quasi static micromirror with no high order mechanical resonances (e.g., block 20 is not used). This plot shows the simulated mirror position (solid line) compared to the applied INPUT signal (dashed line, scaled to the mirror opening angle).

Figure 14A:
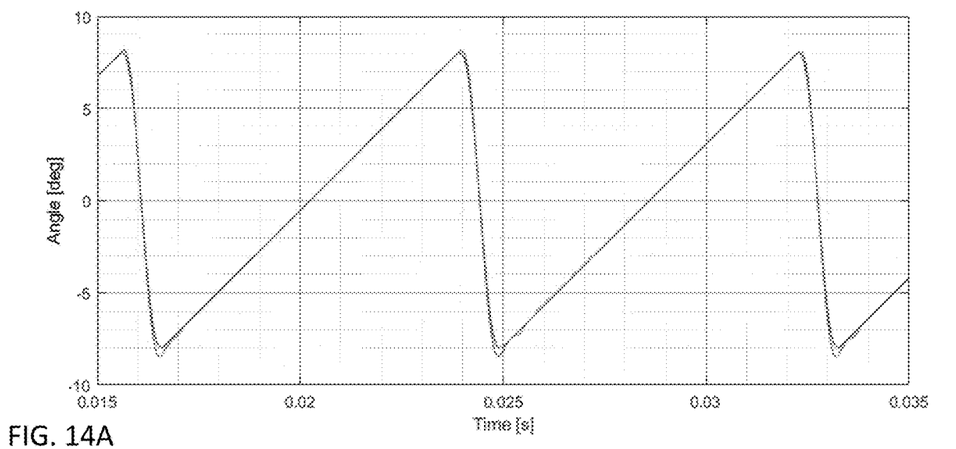
FIGS. 14A-14B are additional graphs showing the correspondence between the input signal and the opening angle of the quasi static micromirror, when using the control system described herein.
Figure 14B:
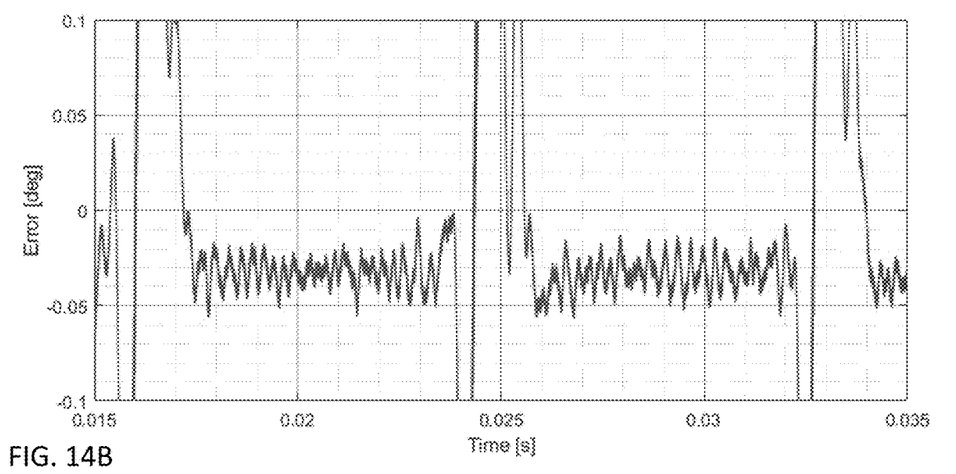

As can be seen in FIGS. 14A-14B, the total error between the input signal INPUT and the opening angle of the micromirror 19b is within 0.05°, between −7° and +8° degrees of opening angle. FIGS. 14A-14B are analogous to FIGS. 13A-13B in the case when a quasi static micromirror with significant high order mechanical resonances is controlled. In this case the higher order resonance equalization circuit 20 is also applied to the system, to achieve the effect shown in FIG. 9. In particular, the second plot shows the effect of a large resonance peak on the position error. The FBK signal applied to the controller is now shaped by the transfer function of the higher order resonance equalization circuit 20, and although the double integration is no longer able to keep the tracking error to zero, it is able to keep its mean constant within one signal period while limiting the amplitude of residual oscillations to within 50 mdeg peak-to-peak on the useful part of the signal trace.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A control system for a projection system, comprising:
   a first subtractor receiving an input drive signal and a feedback signal and configured to generate a first difference signal therefrom, wherein the feedback signal is indicative of position of a micromirror of the projection system;
   a type-2 compensator configured to receive the first difference signal and generate therefrom a first output signal;
   a derivative based controller configured to receive the feedback signal and generate therefrom a second output signal;
   a second subtractor receiving the first and second output signals and configured to generate a second difference signal therefrom, wherein the second difference signal serves to control a mirror driver of the projection system; and
   a higher order resonance equalization circuit receiving a pre-output signal from an analog front end of the projection system that is indicative of position of the micromirror, and generating the feedback signal therefrom.

2. The control system of claim 1, wherein the type-2 compensator is lead-lag based and processes the first difference signal such that the first output signal serves to extend system bandwidth while compensating for non-linearities in mirror spring behavior and/or compensating for actuation non-linearities.

3. The control system of claim 1, wherein the derivative based controller processes the feedback signal such that the second output signal serves to dampen a quality factor of a fundamental resonant mode of the micromirror.

4. The control system of claim 1, wherein the higher order resonance equalization circuit removes higher order resonances from the pre-output signal introduced by the micromirror.

5. The control system of claim 1, wherein the first subtractor, type-2 compensator, derivative based controller, second subtractor, and higher order resonance equalization circuit are implemented as digital circuits; further comprising a digital to analog converter that converts the second difference signal to analog form, an analog to digital converter that digitizes the pre-output signal, and a low pass filter that filters the pre-output signal before processing by the higher order resonance equalization circuit.

6. The control system of claim 5, wherein the type-2 compensator comprises:
 a gain stage receiving the first difference signal and configured to apply gain thereto;
 a first integrator receiving output of the gain stage and configured to perform an integration;
 a second integrator receiving output of the first integrator and configured to perform an integration; and
 a lead-lag filter receiving output of the second integrator and configured to apply filtering thereto.

7. The control system of claim 6, wherein the first and second integrators have an antiwindup technique applied thereto to enable quick recovery from saturation at startup and during transients.

8. The control system of claim 1, wherein the first subtractor, type-2 compensator, derivative based controller, second subtractor, and higher order resonance equalization circuit are implemented as analog circuits; and wherein the first subtractor comprises a first amplifier having: an inverting input coupled to the higher order resonance equalization circuit through a first resistor and coupled to an output of the first amplifier through a second resistor, and a non-inverting input coupled to receive the input drive signal through a third resistor.

9. The control system of claim 8, wherein the type-2 compensator comprises:
 a second amplifier having a non-inverting input coupled to ground, and having an inverting input coupled to the output of the first amplifier through a fourth resistor;
 a first series RC circuit coupled between an inverting input and an output of the second amplifier;
 a first clamp coupled between the inverting input and the output of the second amplifier;
 a third amplifier having a non-inverting input coupled to ground, and an inverting input coupled to the output of the second amplifier through a first parallel RC circuit;
 a second series RC circuit coupled between the inverting input and the output of the third amplifier;
 a second clamp coupled between the inverting input and the output of the third amplifier; and
 a fifth resistor coupling the output of the third amplifier and the second subtractor.

10. The control system of claim 9, wherein the second subtractor comprises:
 a fourth amplifier having a non-inverting input coupled to the fifth resistor, and coupled to ground through a sixth resistor, the fourth amplifier also having an inverting input coupled to the derivative based controller through a sixth resistor;
 a second parallel RC circuit coupled between the inverting input and an output of the fourth amplifier; and
 a third clamp coupled between the output of the fourth amplifier and ground.

11. The control system of claim 10, wherein the derivative based controller comprises:

a fifth amplifier having a non-inverting input coupled to ground through a seventh resistor, and coupled to the third resistor through a capacitor;
a third parallel RC circuit coupled between an inverting input of the fifth amplifier and an output of the fifth amplifier, the output of the fifth amplifier being coupled to the sixth resistor; and
an eighth resistor coupled between the inverting input of the fifth amplifier and ground.

12. A method of operating a control system for a projection system, the method comprising:
 receiving an input drive signal and a feedback signal and generating therefrom a first difference signal, wherein the feedback signal is indicative of position of a micromirror of the projection system;
 receiving the first difference signal and generating therefrom a first output signal by applying a type-2 compensation;
 receiving the feedback signal and generating therefrom a second output signal by applying a derivative function;
 receiving the first and second output signals and generating a second difference signal therefrom, wherein the second difference signal serves to control a mirror driver of the projection system; and
 receiving a pre-output signal from an analog front end of the projection system that is indicative of position of the micromirror, and generating the feedback signal therefrom by applying a higher order resonance equalization.

13. The method of claim 12, wherein the application of the higher order resonance equalization is performed by applying to the pre-output signal a transfer function of:

$$H_{BQj}(z) = \frac{b_{0j} + b_{1j}z^{-1} + b_{2j}z^{-2}}{a_{0j} + a_{1j}z^{-1} + a_{2j}z^{-2}}$$

where j is a j-th unit cell of a biquad filter used to apply the higher order resonance equalization.

14. The method of claim 12, wherein the applying of the type-2 compensation is performed by applying, twice, to the first difference signal a first transfer function of:

$$\frac{a_0 + a_1 z^{-1}}{1 - z^{-1}}$$

15. The method of claim 14, further comprising applying a lead-lag filtering to the first difference signal after applying the first transfer function.

16. The method of claim 15, wherein the lead-lad filtering comprises applying to the first difference signal, after application of the first transfer function, applying a second transfer function of:

$$\frac{b_0 + (b_1 - b_0)z^{-1}}{1 + (b_2 - 1)z^{-1}}$$

17. The method of claim 12, wherein the applying of the type-2 compensation is performed by applying to the first difference signal, twice, a first transfer function of:

$$\frac{a_0 + (a_1 - a_0)z^{-1}}{1 - z^{-1}}$$

18. The method of claim 17, further comprising applying a lead-lag filtering to the first difference signal after applying the first transfer function.

19. The method of claim 18, wherein the lead-lad filtering comprises applying to the first difference signal, after application of the first transfer function, applying a second transfer function of:

$$\frac{b_0 + (b_1 - b_0)z^{-1}}{1 + (b_2 - 1)z^{-1}}$$

\* \* \* \* \*